United States Patent [19]

Bloss et al.

[11] Patent Number: 4,954,367
[45] Date of Patent: Sep. 4, 1990

[54] VAPOR DEPOSITION OF BIS-TRIBUTYLTIN OXIDE

[75] Inventors: Karl H. Bloss, Pittsburgh; Peter P. Harmon, North Huntington, both of Pa.

[73] Assignee: PPG Industries, Inc., Pittsburgh, Pa.

[21] Appl. No.: 219,691

[22] Filed: Jul. 5, 1988

[51] Int. Cl.$^5$ ............................................. B05D 5/12
[52] U.S. Cl. ................................... 427/109; 427/108; 427/126.3; 427/165; 427/166; 427/226; 427/255.3
[58] Field of Search ............ 427/109, 166, 226, 126.3, 427/255.3, 108, 165

[56] References Cited

U.S. PATENT DOCUMENTS

| | | | |
|---|---|---|---|
| 3,944,684 | 3/1976 | Kane et al. | 427/109 |
| 3,949,146 | 4/1976 | Kane et al. | 427/109 |
| 4,731,256 | 3/1988 | Russo et al. | 427/109 |

*Primary Examiner*—Janyce Bell
*Attorney, Agent, or Firm*—Donna L. Seidel

[57] ABSTRACT

An organotin coating composition comprising bis-tributyltin oxide is disclosed, along with a chemical vapor deposition method for pyrolyzing it to form a tin oxide film on the surface of a substrate.

12 Claims, No Drawings

VAPOR DEPOSITION OF BIS-TRIBUTYLTIN OXIDE

BACKGROUND OF THE INVENTION

The present invention relates generally to the art of infrared-reflecting coated glass products, and more particularly to non-iridescent, high transmittance, low emissivity, infrared-reflecting coated glass products.

Transparent infrared-reflecting films such as tin oxide may be deposited on a substrate such as glass by a variety of methods, including the application of thermally decomposable compounds to a heated surface. Useful methods for forming transparent infrared-reflecting tin oxide films are taught in U.S. Pat. No. 3,107,177 to Saunders et al, U.S. Pat. No. 3,677,814 to Gillery, and U.S. Pat. No. 4,263,335 to Wagner et al.

Tin oxide films are especially effective infrared reflectors at thicknesses of about 1000 to 8000 Angstroms. However, at such thicknesses the films tend to display interference effects, i.e., multiple visible colors commonly referred to as iridescence. These interference effects render the coated glass aesthetically unacceptable for most architectural applications. Iridescence is not observed in thinner films; however, these films have insufficient infrared reflectance to be practically useful. Likewise, iridescence is not observed in thicker films; however, these films tend to be hazy and difficult to deposit uniformly. Therefore, various methods to mask interference effects have been developed.

U.S. Pat. No. 3,710,074 to Stewart discloses an electrically heated multiple glazed window unit having an electroconductive coating on an enclosed surface and a selective reflecting film having an absolute infrared reflectance of at least 0.7 to improve the heat insulating character of the unit and reduce the visible iridescence of the conductive film.

U.S. Pat. No. 4,069,630 to Chess et al discloses a heat reflecting multiple glazed window comprising a colored, heat absorbing exterior glass sheet having a heat reflecting tin oxide film on its interior surface, and an interior glass sheet which may be either clear glass or colored. The tin oxide film typically has an interference color from first order red to fourth order red, the visual effect of which is attenuated by the colored heat absorbing glass.

U.S. Pat. Nos. 4,187,336; 4,206,252 and 4,308,316 to Gordon disclose transparent glass window structures comprising a glass sheet bearing a first coating of infrared reflective material, wherein the observance of iridescence resulting from the first coating is reduced by a second coating of particular refractive index and thickness providing at least two interfaces forming means to reflect and refract light to interfere with the observance of iridescence.

U.S. Pat. No. 4,377,613 to Gordon discloses transparent window structures comprising a glass sheet bearing a coating of infrared reflective material wherein the observance of iridescence is reduced by provision of a very thin coating system beneath the infrared reflective coating which reflects and refracts light to interfere with the observation of iridescence.

U.S. application Ser. No. 768,922 filed Aug. 23, 1985, by V. A. Henery et al discloses an alternative method for masking the visible interference effects of an infrared reflecting film in a window unit, which involves masking e visible interference effects of an infrared reflecting film by means of a second film having a uniform reflectance in the visible wavelength range combined with a luminous reflectance which is significantly higher than that of the infrared reflecting film. To produce a high transmittance, low emissivity unit, the thickness of the infrared reflecting film is preferably chosen to correspond with the first minimum in the reflectance curve.

SUMMARY OF THE INVENTION

The present invention provides a method for producing haze-free infrared reflective tin oxide films by the oxidative pyrolysis of a halogen free coating reactant, specifically bis-tributyltin oxide.

DESCRIPTION OF THE PREFERRED EMBODIMENTS

Infrared reflecting films exhibiting visible interference effects may be useful on a monolithic sheet. Preferred articles in accordance with the present invention are multiple glazed window units comprising at least two panes, preferably both glass. Conventional glass compositions are useful, especially typical soda-lime-silica glass produced on a float line. Heat absorbing tinted glasses may be employed; but for high transmittance application, clear glass is preferred.

Of the various infrared reflecting films which may be useful for solar energy control, tin oxide is preferred. Tin oxide films may be deposited on glass surfaces by a variety of methods such as pyrolytic deposition, powder coating, chemical vapor deposition and cathode sputtering. Suitable methods include pyrolysis of alkyltin fluorides as taught in U.S. Pat. Nos. 3,677,814 to Gillery and 4,263,335 to Wagner et al; chemical vapor deposition as taught in U.S. Pat. No. 3,850,679 to Sopko et al; powder coating as taught in U.S. Pat. No. 4,325,988 to Wagner and U.S. Pat. No. 4,344,986 to Henery; and cathode sputtering as taught in U.S. Pat. Nos. 3,477,936 and 3,506,556 to Gillery et al.

Preferred tin oxide infrared reflecting films produced by chemical vapor deposition from bis-tributyltin oxide in accordance with the present invention have a resistivity less than about 50 ohms per square, more preferably in the range 20 to 30 ohms per square, and a low emissivity, preferably less than 0.4. The thickness of the film is chosen to correspond with a minimum in the luminous reflectance curve. Preferably, the film thickness corresponds to the first minimum since this point represents the lowest visible reflectance obtainable for a tin oxide film. This point corresponds with the second order blue interference effect at a thickness of about 1400 Angstroms. Coating process parameters are adjusted to yield the minimum resistivity for the given thickness to provide maximum infrared reflectance and minimum emissivity. If lower resistivity is desired for higher solar energy performance, a thicker infrared reflecting tin oxide film may be formed, preferably at a thickness near the second minimum in the luminous reflectance curve, most preferably at the thickness corresponding with the third order blue interference effect, about 2750 Angstroms.

In the preferred embodiment wherein the thickness of the tin oxide infrared reflecting film corresponds with the first minimum in the spectral reflectance curve, the film typically appears blue by interference effects, the visible reflectance is about 10 percent, and the resistivity is generally about 45 to 50 ohms per square.

Articles in accordance with the present invention are effective for passive solar heating applications because the high transmittance allows solar energy into a structure, while the high infrared reflectance and low emissivity keep heat generated inside the structure from being lost. Because the coating reactant of the present invention is halogen-free, the tin oxide films of the present invention are free of haze caused by reaction of chlorine with sodium from the glass. Higher performance coatings may be formed by doping the tin oxide with fluorine. For example, fluorine containing compounds such as trifluoroacetic acid may be added to the tributyl tin oxide, preferably about 1 to 10 percent by weight, most preferably about 5 percent. The present invention will be further illustrated in detail by the specific examples which follow.

EXAMPLE I

A clear float glass substrate is heated in a furnace at 1300° F. (about 704° C.) for about 4 minutes. The hot glass is then passed at a line speed of 280 inches (about 7.1 meters) per minute past a slot shaped nozzle with a nozzle width of 0.125 inch (about 3.175 millimeters) spaced 0.25 inch (about 6.35 millimeters) above the glass surface. The nozzle is supplied with bis-tributyltin oxide vaporized at 490° F. (about 254° C.) carried in air at a rate of 20 cubic feet per minute. A tin oxide coating is deposited which exhibits 0.0% haze when analyzed using a Gardner XL211 Hazeguard System with the illuminant "C" filter.

The above example is offered Only to illustrate the present invention. Optimization of the coatinG apparatus, process parameters, and composition are expected to provide even lower resistance haze-free films and are included within the scope of the invention. The transmittance, reflectance and resistance values may be altered by varying the relative coating thicknesses or by controlling coating process parameters in accordance with the various known coating techniques. The scope of the present invention is defined by the following claims.

We claim:
1. A method of forming a tin oxide coating comprising the steps of:
   a. contacting a surface of a substrate in an oxidizing atmosphere with bis-tributyltin oxide and a fluorine-containing compound;
   b. maintaining a temperature sufficient to thermally react said bis-tributyltin oxide; and
   c. pyrolyzing said bis-tributyltin oxide to deposit a fluorine-containing tin oxide film on said surface.
2. A method according to claim 1, wherein said substrate is glass.
3. A method according to claim 2, wherein said bis-tributyl oxide is in vapor form.
4. A method according to claim 3, wherein said vapor is combined with a carrier gas to form a mixture.
5. A method according to claim 4, wherein said carrier gas is air.
6. A method according to claim 5, wherein said fluorine-containing compound is an acid.
7. A method according to claim 6, wherein said fluorine containing compound is trifluoroacetic acid.
8. A method according to claim 7, wherein said mixture comprises about 1 to 10 percent by weight trifluoroacetic acid based on the weight of bis-tributyltin oxide.
9. A method according to claim 8, wherein said mixture comprises about 5 percent by weight trifluoroacetic acid.
10. A method according to claim 1, wherein said substrate is contacted with bis-tributyltin oxide at a temperature of at least 350° C.
11. A method according to claim 10, wherein said substrate is contacted with bis-tributyltin oxide at a temperature in the range of 500 to 700° C.
12. A method according to claim 11, wherein said substrate is contacted with bis-tributyltin oxide at a temperature in the range of 600 to 650° C.

* * * * *